US009299440B2

United States Patent
Grunzke

(10) Patent No.: US 9,299,440 B2
(45) Date of Patent: *Mar. 29, 2016

(54) METHODS AND APPARATUSES INCLUDING A VARIABLE TERMINATION IMPEDANCE RATIO

(71) Applicant: Micron Technology, Inc., Boise, ID (US)

(72) Inventor: Terry M. Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/064,779

(22) Filed: Oct. 28, 2013

(65) Prior Publication Data

US 2014/0050030 A1    Feb. 20, 2014

Related U.S. Application Data

(63) Continuation of application No. 13/281,139, filed on Oct. 25, 2011, now Pat. No. 8,570,063.

(51) Int. Cl.
*H03K 19/003* (2006.01)
*G11C 16/06* (2006.01)
*H03K 19/0185* (2006.01)
*H03K 19/00* (2006.01)

(52) U.S. Cl.
CPC ............ *G11C 16/06* (2013.01); *H03K 19/0005* (2013.01); *H03K 19/018571* (2013.01)

(58) Field of Classification Search
USPC ................................. 326/21, 30–35
See application file for complete search history.

(56) References Cited

U.S. PATENT DOCUMENTS

| 6,356,106 | B1 * | 3/2002 | Greeff et al. ................ 326/30 |
| 6,466,487 | B1 * | 10/2002 | Otsuka ................. 365/189.05 |
| 6,515,501 | B2 * | 2/2003 | Bosnyak et al. ............. 326/30 |
| 6,777,976 | B2 * | 8/2004 | Kuge ........................ 326/30 |
| 7,064,989 | B2 | 6/2006 | Na et al. |
| 7,443,741 | B2 | 10/2008 | Butt et al. |
| 7,482,832 | B2 | 1/2009 | Koshita et al. |
| 7,489,160 | B2 * | 2/2009 | Kimura ...................... 326/30 |
| 7,495,468 | B2 | 2/2009 | You et al. |
| 7,633,310 | B2 * | 12/2009 | Fukushi ..................... 326/30 |
| 7,710,144 | B2 | 5/2010 | Dreps et al. |

(Continued)

OTHER PUBLICATIONS

"DDR3 Dynamic On-Die Termination", Micron Technical Note TN-41-04, [Online]. Retrieved from the Internet: <URL: http://www.micron.com/~/media/Documents/Products/Technical%20Note/DRAM/TN4104.pdf>, (2008), 5 pgs.

(Continued)

*Primary Examiner* — Douglas W Owens
*Assistant Examiner* — James H. Cho
(74) *Attorney, Agent, or Firm* — Schwegman Lundberg & Woessner, P.A.

(57) ABSTRACT

Methods of changing a centerline voltage of a data signal are described, along with apparatuses to change the centerline voltage. In one such method, portions of a termination circuit coupled to an output pin are selectively activated to change an impedance of the termination circuit to change the centerline voltage of the data signal driven to the output pin. One such apparatus includes pull-up impedances and pull-down impedances that can be activated to change the centerline voltage of the data signal. Additional embodiments are also described.

11 Claims, 6 Drawing Sheets

(56) References Cited

U.S. PATENT DOCUMENTS

| | | |
|---|---|---|
| 7,742,347 B2 | 6/2010 | Lee et al. |
| 7,761,714 B2* | 7/2010 | Luzzi et al. .................. 713/182 |
| 8,570,063 B2* | 10/2013 | Grunzke ........................ 326/30 |
| 2005/0001650 A1 | 1/2005 | Schafer |
| 2010/0097095 A1* | 4/2010 | Kao ............................. 326/30 |
| 2010/0195421 A1 | 8/2010 | Jeddeloh |
| 2010/0332921 A1 | 12/2010 | Schaefer |
| 2011/0205832 A1* | 8/2011 | Jeon ........................ 365/233.16 |
| 2012/0042148 A1 | 2/2012 | Grunzke |
| 2012/0182044 A1* | 7/2012 | Oh ................................. 326/30 |
| 2013/0099818 A1 | 4/2013 | Grunzke |

OTHER PUBLICATIONS

"DDR3 ZQ Calibration", Micron Technical Note TN-41-02, [Online]. Retrieved from the Internet: <URL: http://www.micron.com/~/media/Documents/Products/Technical%20Note/DRAM/TN4102.pdf>, (2008), 5 pgs.

"How to Use DDR2 SDRAM", Elpida User's Manual, [Online]. Retrieved from the Internet: <URL: http://www.elpida.com/pdfs/E0437E40.pdf>, (2007), 40 pgs.

\* cited by examiner

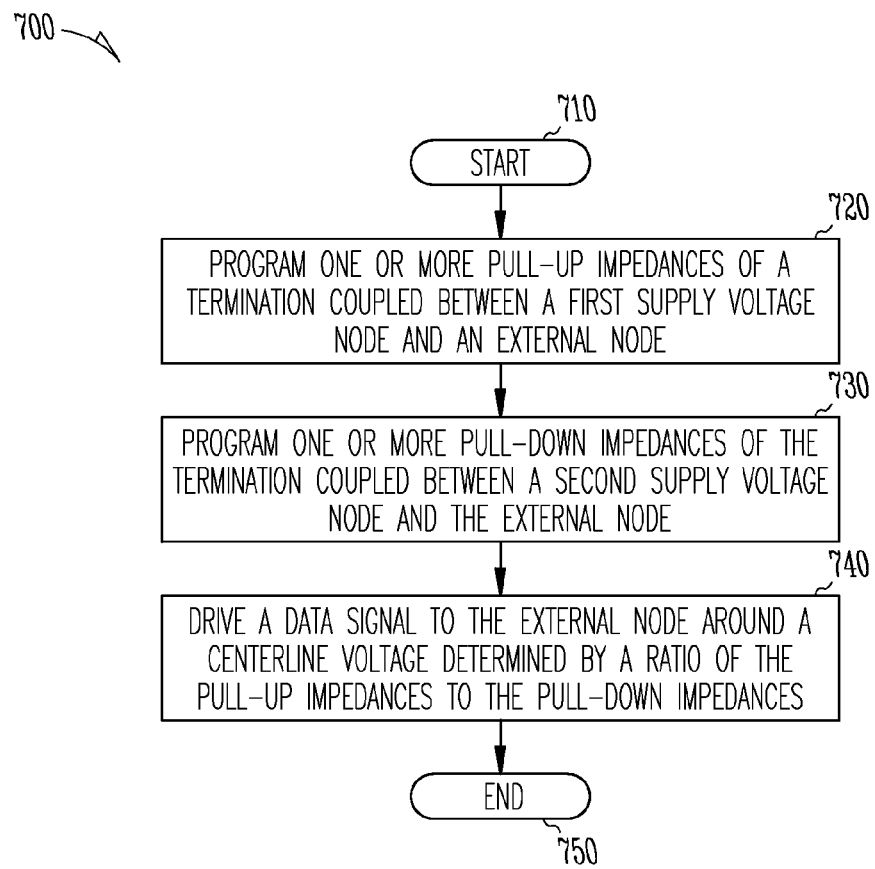

METHODS AND APPARATUSES INCLUDING A VARIABLE TERMINATION IMPEDANCE RATIO

RELATED APPLICATIONS

This is continuation of U.S. Ser. No. 13/281,139 filed Oct. 25, 2011 and issued as U.S. Pat. No. 8,570,063, that is incorporated herein by reference in its entirety.

BACKGROUND

Semiconductor devices are widely used in many systems such as personal digital assistants (PDAs), laptop computers, mobile phones and digital cameras. Semiconductor devices must drive data signals within performance specifications so that other components in a system can properly receive the data signals.

BRIEF DESCRIPTION OF THE DRAWINGS

Some embodiments are illustrated by way of example and not limitation in the figures of the accompanying drawings in which:

FIG. 6 is a block diagram of a termination register according to various embodiments of the invention;

FIG. 7 is a flow diagram of one method according to various embodiments of the invention.

DETAILED DESCRIPTION

In this description, a transistor is described as being activated or switched on when it is rendered conductive by a control terminal voltage that is separated from its source voltage by at least its threshold voltage. The transistor is described as being in an inactive state or switched off when the control terminal voltage is separated from its source voltage by less than the threshold voltage and the transistor is rendered non-conductive.

Figure 1:
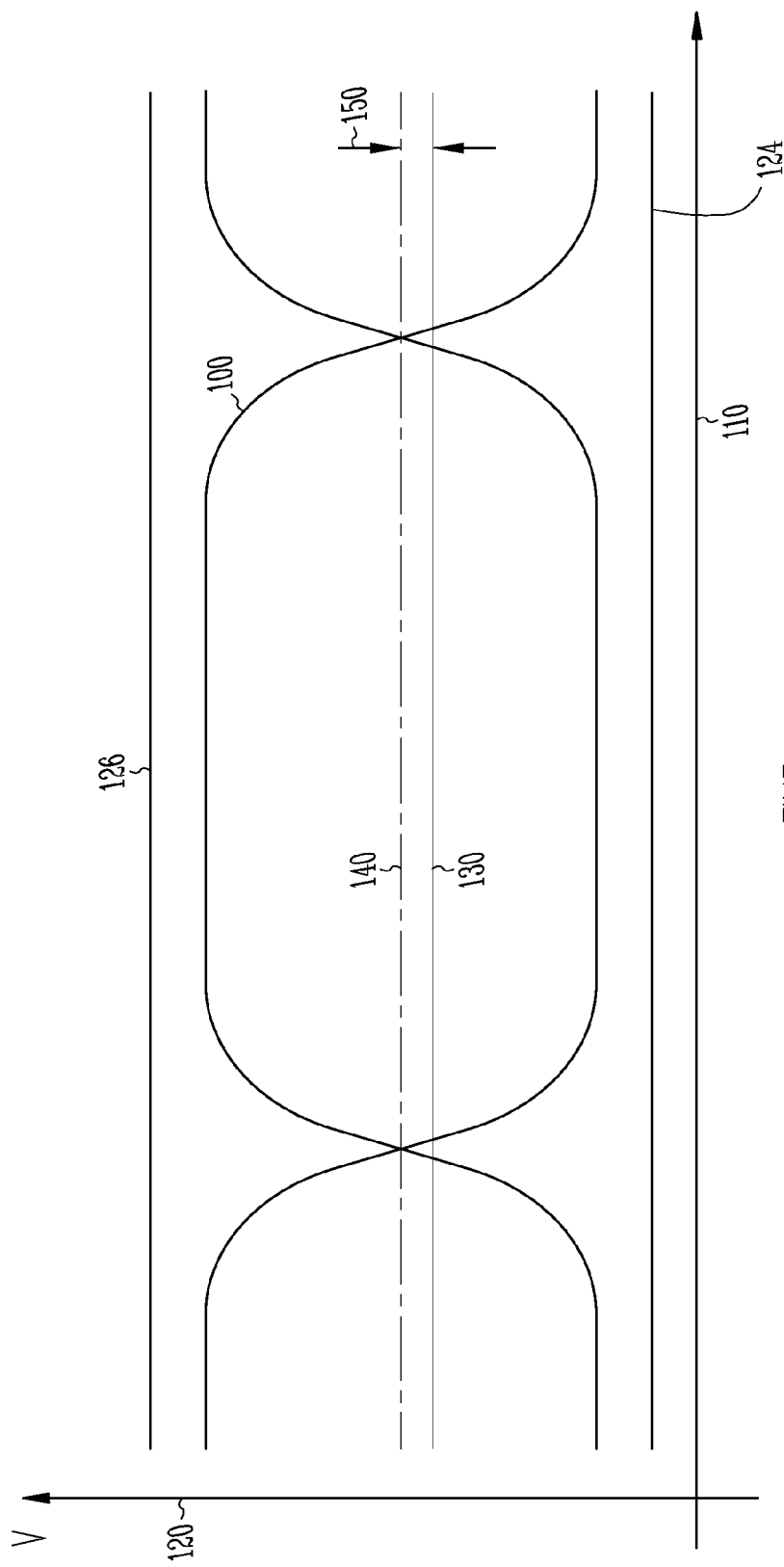
FIG. 1 is a graph of a data eye according to various embodiments of the invention.

FIG. 1 is a graph of a data eye 100 according to various embodiments of the invention. A horizontal axis 110 represents time and a vertical axis 120 represents a voltage of the data eye 100. The data eye 100 represents a digital data signal on a conductive line that is repetitively sampled. The data eye 100 is bounded by a lower voltage 124 and an upper voltage 126 of a system. The data eye 100 illustrates a time between rising and falling edges of the data signal, and defines an interval in which the data signal is valid.

The data signal is sensed with respect to a reference voltage 130 of a component receiving the data signal to generate the data eye 100. The data eye 100 represents multiple samples of the data signal. An ideal data eye 100 has complementary rising and falling edges that are balanced around the reference voltage 130. The data eye 100 can have a centerline voltage 140 that is offset with respect to the reference voltage 130 by a DC offset 150. The data signal has the same centerline voltage 140 of the data eye 100, and is transmitted around the centerline voltage 140. The DC offset 150 indicates a narrowed data eye 100 that limits the interval in which the data signal is valid.

The inventor has discovered that such challenges, as well as others, can sometimes be addressed by adjusting impedances in a termination to move the data eye 100 such that the centerline voltage 140 of the data eye 100 is substantially coincident with the reference voltage 130 and the DC offset 150 is approximately zero.

A termination is a dissipating or damping load, typically a resistive device, that has an impedance that is substantially similar to a characteristic impedance of a conductive line. The termination is used to damp or dissipate signal reflections on the conductive line. The termination can be placed in a driver or a receiver or in both a driver and a receiver connected to the conductive line.

Figure 2:
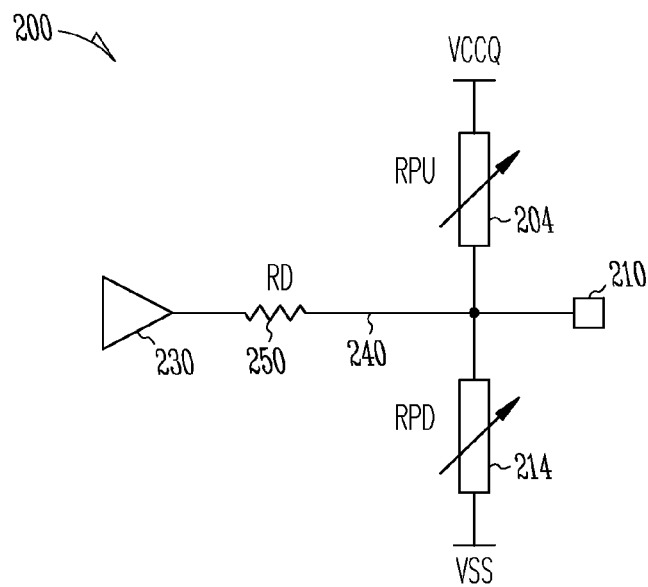
FIG. 2 is an electrical schematic diagram of an apparatus in the form of a driver and termination circuit according to various embodiments of the invention.

FIG. 2 is an electrical schematic diagram of an apparatus in the form of a driver and termination circuit 200 according to various embodiments of the invention. The driver and termination circuit 200 includes an adjustable pull-up impedance (RPU) 204 coupled between a high supply voltage VCCQ and an output pin 210. The driver and termination circuit 200 also includes an adjustable pull-down impedance (RPD) 214 coupled between a low supply voltage VSS and the output pin 210. The low supply voltage VSS may be a ground voltage reference. The RPU 204 and the RPD 214 together comprise a termination for the output pin 210. A ratio of the RPU 204 to the RPD 214 determines a centerline voltage of a digital data signal driven by a driver circuit 230 to the output pin 210 on a line 240. The driver circuit 230 has a characteristic resistance (RD) 250. The centerline of the data signal on the output pin 210 can be changed by changing the resistance value of one or both of the RPU 204 and the RPD 214.

Figure 3:
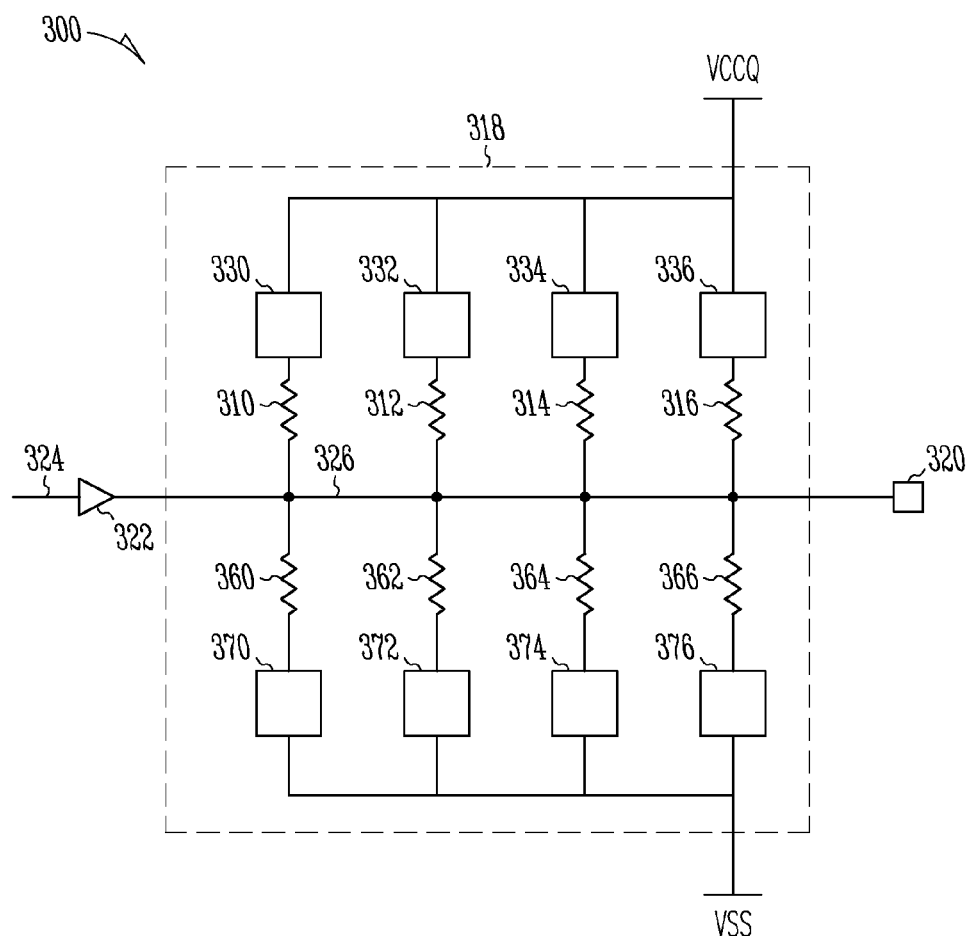
FIG. 3 is an electrical schematic diagram of an apparatus in the form of a driver and termination circuit according to various embodiments of the invention.

FIG. 3 is an electrical schematic diagram of an apparatus in the form of a driver and termination circuit 300 according to various embodiments of the invention. The driver and termination circuit 300 includes four resistors 310, 312, 314 and 316 of a termination 318 coupled in parallel to an output pin 320 on a bus line (not shown). The four resistors 310, 312, 314 and 316 are pull-up impedances. A driver circuit 322 can drive a data signal from a line 324 to the output pin 320 over a line 326. Each of the resistors 310, 312, 314 and 316 is coupled in series with a respective fuse 330, 332, 334 and 336. Some of the fuses 330, 332, 334 and 336 are left unchanged during fabrication. Others of the fuses 330, 332, 334 and 336 are opened during fabrication to leave some of the resistors 310, 312, 314 and 316 coupled between the output pin 320 and a high supply voltage VCCQ while others of the resistors 310, 312, 314 and 316 are floating (coupled only to the output pin 320) to adjust a pull-up impedance of the driver and termination circuit 300.

Four resistors 360, 362, 364 and 366 in the termination 318 are similarly coupled in parallel to the output pin 320. The four resistors 360, 362, 364 and 366 are pull-down impedances. Each of the resistors 360, 362, 364 and 366 is coupled in series with a respective fuse 370, 372, 374 and 376. Some of the fuses 370, 372, 374 and 376 are left unchanged during fabrication. Others of the fuses 370, 372, 374 and 376 are opened during fabrication to leave some of the resistors 360, 362, 364 and 366 coupled between the output pin 320 and a low supply voltage VSS, while others of the resistors 360, 362, 364 and 366 are floating to adjust a pull-down impedance of the driver and termination circuit 300. A ratio of the pull-up impedance to the pull-down impedance determines the centerline voltage of a data signal transmitted from the driver and termination circuit 300 and the resulting data eye. There may be more or fewer than eight resistors coupled in parallel to the output pin 320. The low supply voltage VSS may be a ground voltage reference.

The fuses 330, 332, 334, 336, 370, 372, 374 and 376 may be antifuses according to various embodiments of the invention. Some of the antifuses can be fused during fabrication to leave some of the resistors 310, 312, 314 and 316 coupled between the output pin 320 and a high supply voltage VCCQ, while others of the resistors 310, 312, 314 and 316 are floating to select a pull-up impedance of the driver and termination circuit 300. Some of the antifuses can be fused during fabrication to leave some of the resistors 360, 362, 364 and 366 coupled between the output pin 320 and the low supply voltage VSS, while others of the resistors 360, 362, 364 and 366 are floating to select a pull-down impedance of the driver and termination circuit 300.

Figure 4:
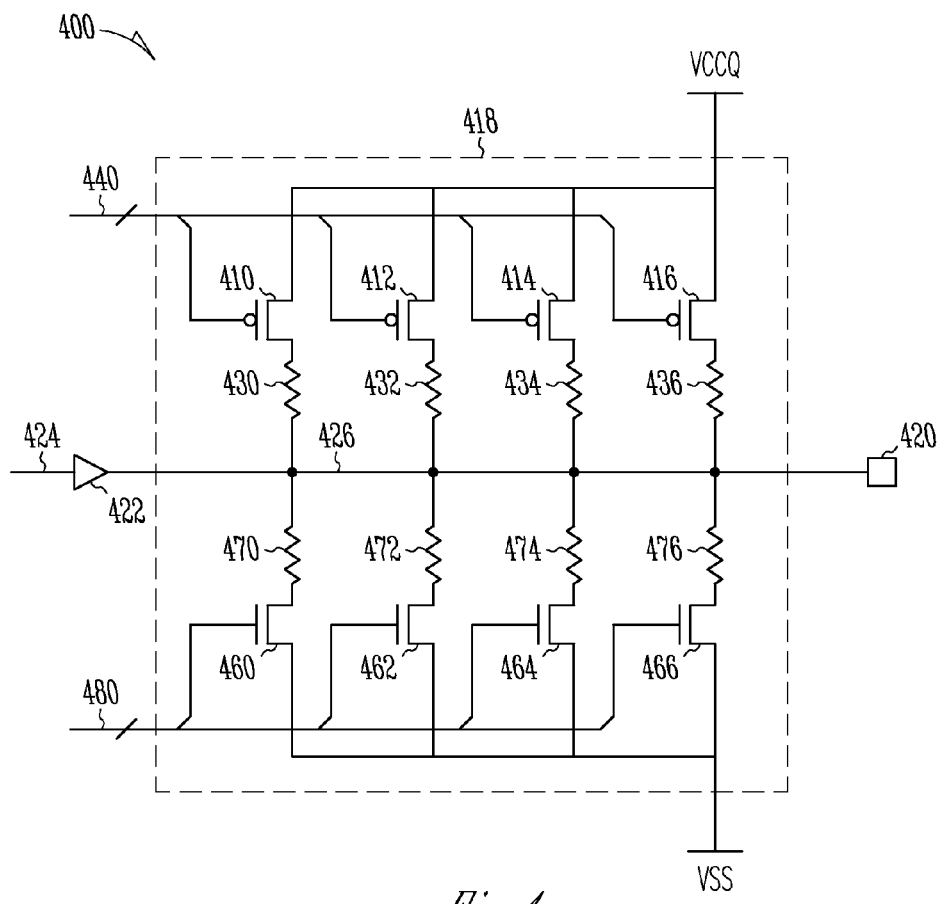
FIG. 4 is an electrical schematic diagram of an apparatus in the form of a driver and termination circuit according to various embodiments of the invention.

FIG. 4 is an electrical schematic diagram of an apparatus in the form of a driver and termination circuit 400 according to various embodiments of the invention. The driver and termination circuit 400 includes four n-channel transistors 410, 412, 414 and 416 in a termination 418 coupled in parallel between an output pin 420 on a bus line (not shown) and a high supply voltage VCCQ. The transistors 410, 412, 414 and 416 are pull-up impedances, and more particularly pull-up transistors. A driver circuit 422 can drive a data signal from a line 424 to the output pin 420 over a line 426. Each of the transistors 410, 412, 414 and 416 is coupled in series with a respective resistor 430, 432, 434 and 436 in the termination 418 between the output pin 420 and the high supply voltage VCCQ. A gate of each of the transistors 410, 412, 414 and 416 is coupled to a respective control signal on four control lines 440. The control signals are received from a control circuit (not shown) to switch on or switch off the transistors 410, 412, 414 and 416 to adjust a pull-up impedance of the driver and termination circuit 400.

Four n-channel transistors 460, 462, 464 and 466 in the termination 418 are similarly coupled in parallel between the output pin 420 and a low supply voltage VSS. The transistors 460, 462, 464 and 466 are pull-down impedances, and more particularly pull-down transistors. Each of the transistors 460, 462, 464 and 466 is coupled in series with a respective resistor 470, 472, 474 and 476 in the termination 418 between the output pin 420 and the low supply voltage VSS. A gate of each of the transistors 460, 462, 464 and 466 is coupled to a respective control signal on four control lines 480. The control signals are received from the control circuit (not shown) to switch on or switch off the transistors 460, 462, 464 and 466 to adjust a pull-down impedance of the driver and termination circuit 400. A ratio of the pull-up impedance to the pull-down impedance determines the centerline voltage of a data signal transmitted from the driver and termination circuit 400 and the resulting data eye. In this manner, portions of the termination 418 are selectively activated to change an impedance of the termination 418 to change a centerline voltage of a data signal driven to the output pin 420.

There may be more or fewer than four n-channel transistors and resistors coupled in parallel between the output pin 420 and the high supply voltage VCCQ. There may also be more or fewer than four n-channel transistors and resistors coupled in parallel between the output pin 420 and the low supply voltage VSS. The resistors 430, 432, 434, 436, 470, 472, 474 and 476 in the termination 418 are optional, and the termination 418 may include transistors without resistors. The low supply voltage VSS may be a ground voltage reference.

Figure 5:
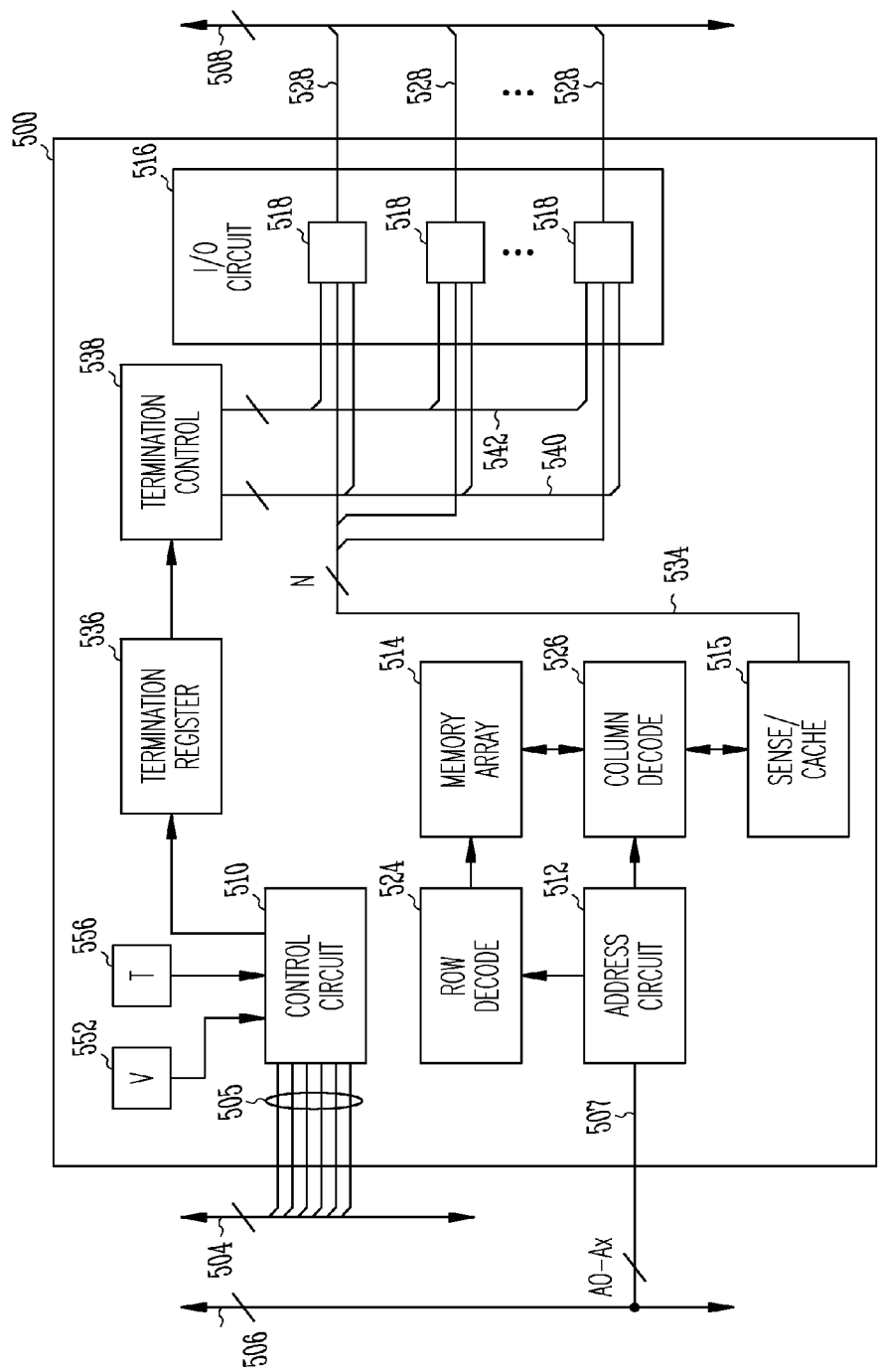
FIG. 5 is a block diagram of an apparatus in the form of a memory device according to various embodiments of the invention.

FIG. 5 is a block diagram of an apparatus in the form of a memory device 500 according to various embodiments of the invention. The memory device 500 is coupled to a control bus 504 to receive multiple control signals over control signal lines 505. The memory device 500 is also coupled to an address bus 506 to receive address signals A0-Ax on address signal lines 507 and to a data bus 508 to transmit and receive data signals.

The memory device 500 includes one or more arrays 514 of memory cells that can be arranged in rows and in columns. The memory cells of the array 514 are non-volatile memory cells (e.g., Flash memory cells) according to various embodiments of the invention. The memory device 500 can be a NOT AND (NAND) memory device. The array 514 can include multiple banks and blocks of memory cells residing on a single die or multiple dice as part of the memory device 500. The memory cells in the array 514 can be single level (SLC) or multilevel (MLC) memory cells.

An address circuit 512 can latch address signals A0-Ax received on the address signal lines 507. The address signals A0-Ax can be decoded by a row decoder 524 and a column decoder 526 to access information stored in the array 514. The memory device 500 can read data in the array 514 by sensing voltage or current changes in memory cells in the array 514 using sense devices in a sense/cache circuit 515.

A data input and output (I/O) circuit 516 implements bi-directional data communication over data I/O nodes 528 coupled to the data bus 508. The I/O circuit 516 includes N driver and receiver circuits 518 according to various embodiments of the invention. The memory device 500 includes a control circuit 510 that is configured to support operations of the memory device 500, such as writing data to and/or erasing data from the array 514. Data is transferred between the sense/cache circuit 515 and the I/O circuit 516 over N signal lines 534. Each driver and receiver circuit 518 includes a driver and termination circuit such as one of the driver and termination circuits 200, 300 or 400 shown in FIGS. 2, 3 and 4, respectively.

The memory device 500 includes a termination register 536 that is configured to store termination values (e.g., an impedance characteristic to be obtained) according to various embodiments of the invention. The termination register 536 can be volatile or non-volatile storage within the memory device 500. The termination register 536 can be a portion of the array 514 according to various embodiments of the invention. A termination control circuit 538 is configured to select impedances of the terminations in the driver and receiver circuits 518 utilizing (e.g., driving), for example, termination control signal lines 540 and 542 based on the termination values in the termination register 536. The control circuit 510 is configured, at least in part, to manage the operation of termination register 536 and the termination control circuit 538. More specifically, the control circuit 510 can write termination values into the termination register 536. The memory device 500 includes a voltage sensing circuit V 552 coupled to send a voltage signal to the control circuit 510 to indicate a level of a voltage with which the memory device 500 is operating. The memory device 500 also includes a temperature sensing circuit T 556 coupled to send a temperature signal to the control circuit 510 to indicate a temperature of the memory device 500. The control circuit 510 can change the termination values in the termination register 536 based on changes in the voltage signal and/or the temperature signal. The control circuit 510 can also change the termination values in the termination register 536 based on control signals received from another device (not shown) through the control bus 504.

The ratio of the pull-up impedances to the pull-down impedances in the driver and receiver circuits 518 can be changed during operation of the memory device 500. Alternatively, the ratio of the pull-up impedances to the pull-down impedances in the driver and receiver circuits 518 can be set only once such as, for example, during fabrication of a device including driver and termination circuits such as the driver and termination circuit 300 shown in FIG. 3 according to various embodiments of the invention.

FIG. 6 is a block diagram of the termination register 536 according to various embodiments of the invention. The termination register 536 can include N fields for storing termination information (e.g., termination values) according to various embodiments of the invention. The termination register 536 can be loaded during an initialization operation of the memory device 500. The termination values can be written to the array 514 to be accessed during the initialization operation to load the termination register 536, for example. The termination values in the termination register 536 can be changed by the control circuit 510.

FIG. 7 is a flow diagram of one method 700 according to various embodiments of the invention. In block 710, the method 700 begins. In block 720, one or more pull-up impedances are switched on in a termination coupled between a high supply voltage and an output pin. In block 730, one or more pull-down impedances are switched on in the termination coupled between a low supply voltage and the output pin. In block 740, a data signal is driven to the output pin around a centerline voltage determined by a ratio of the pull-up impedances to the pull-down impedances. In block 750, the method 700 ends. Various embodiments may have more or fewer activities than those shown in FIG. 7. The activities shown may be accomplished in the illustrated order, or in another order. Some activities may be substituted for others.

Figure 8:
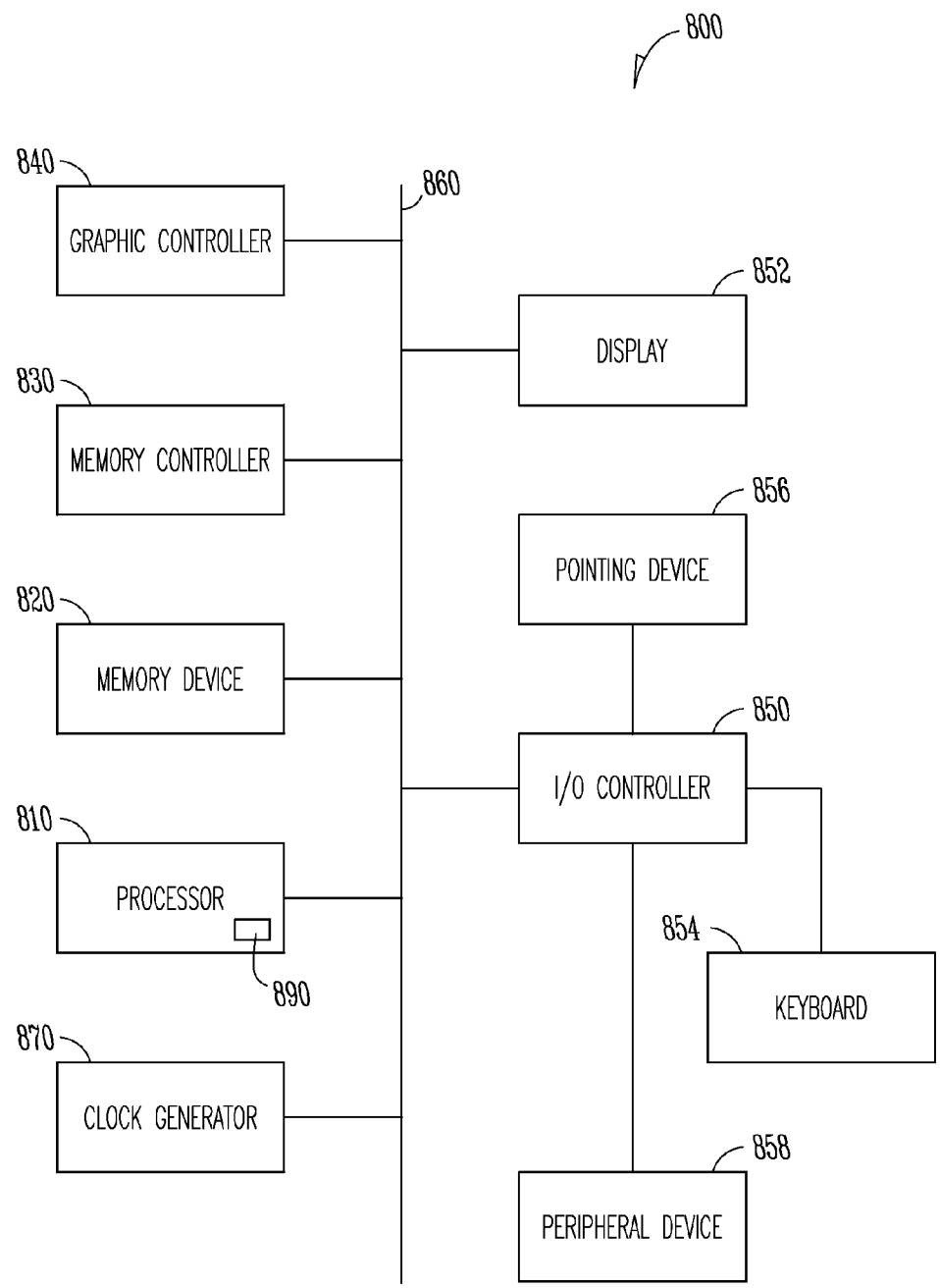
FIG. 8 is a diagram illustrating an apparatus in the form of a system according to various embodiments of the invention.

FIG. 8 is a diagram illustrating an apparatus in the form of a system 800 according to various embodiments of the invention. The system 800 may include a processor 810, a memory device 820, a memory controller 830, a graphic controller 840, an input and output (I/O) controller 850, a display 852, a keyboard 854, a pointing device 856, and a peripheral device 858. A bus 860 couples all of these devices together.

A clock generator 870 can be coupled to the bus 860 to provide a clock signal to at least one of the devices of the system 800 through the bus 860. The clock generator 870 may include an oscillator in a circuit board such as a motherboard. Two or more devices shown in system 800 may be formed in a single integrated circuit chip. The processor 810 can include a driver and termination circuit 890 that can be one of the driver and termination circuits 200, 300 or 400 described herein and shown in the figures according to various embodiments of the invention. The bus 860 may be used to interconnect traces on a circuit board and may have one or more cables. The bus 860 may couple the devices of the system 800 by wireless mechanisms, such as by electromagnetic radiation, for example, radio waves. The peripheral device 858 coupled to the I/O controller 850 may be a printer, an optical device such as a CD-ROM and a DVD reader and writer, a magnetic device reader and writer such as a floppy disk driver, or an audio device such as a microphone.

The memory device 820 can be the memory device 500 described herein and shown in FIG. 5 according to various embodiments of the invention. The control circuit 510 can change the termination values in the termination register 536 based on an analysis of the system 800. The centerline voltage of data signals transmitted by the memory device 500 may need to be changed to accommodate other devices in the system 800 such as the processor 810. The ratio of the pull-up impedances to the pull-down impedances in the driver and receiver circuits 518 can be changed during operation of the memory device 500. A device in the system 800 such as the processor 810 can send the memory device 500 a request signal indicating what the centerline voltage should be, and the control circuit 510 can change the termination values in the termination register 536 based on the request signal.

The system 800 represented by FIG. 8 may include computers (e.g., desktops, laptops, hand-helds, servers, network appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio 3) players, video games, watches, etc.), and the like.

The various embodiments of the invention described herein and shown in FIGS. 1-8 can improve I/O speeds when transmitted data signals are within specifications. An adjustment of a data eye can be accomplished from a single semiconductor device. The adjustment of the data eye can be can be independent for each channel in a device. The various embodiments of the invention can, for example, be applied to Non-volatile semiconductor memories (NVSMs).

Although specific embodiments have been described, it will be evident that various modifications and changes may be made to these embodiments. Accordingly, the specification and drawings are to be regarded in an illustrative rather than a restrictive sense.

What is claimed is:

1. A memory device comprising:
a memory array for storing data;
a termination register configured to store termination values;
a termination control circuit coupled to the termination register; and
an I/O circuit, coupled to the memory array and the termination control circuit, for transmitting data from and receiving data to the memory array, the I/O circuit comprising a plurality of driver and receiver circuits, each of the plurality of driver and receiver circuits having an adjustable pull-up impedance and an adjustable pull-down impedance that are adjusted by the termination control circuit in response to the stored termination values wherein each adjustable pull up impedance and each pull down impedance comprises a plurality of resistance circuits coupled together in parallel, and the plurality of resistance circuits for the adjustable pull up impedance are coupled in parallel between an output pin of the memory device and a supply voltage node;
a temperature sensing circuit configured to indicate a temperature of the memory device; and
a control circuit, coupled to the termination register and the temperature sensing circuit, configured to write the termination values to the termination register and to adjust the termination values stored in the termination register in response to a change in the temperature of the memory device.

2. A memory device comprising:
a memory array for storing data;
a termination register configured to store termination values;

a termination control circuit coupled to the termination register; and an I/O circuit, coupled to the memory array and the termination control circuit, for transmitting data from and receiving data to the memory array, the I/O circuit comprising a plurality of driver and receiver circuits, each of the plurality of driver and receiver circuits having an adjustable pull-up impedance and an adjustable pull-down impedance that are adjusted by the termination control circuit in response to the stored termination values, wherein each adjustable pull-up impedance and each adjustable pull-down impedance comprises a plurality of resistance circuits coupled together in parallel, wherein the plurality of resistance circuits for the adjustable pull-down impedance are coupled in parallel between an output pin of the memory device and a ground voltage node;

a temperature sensing circuit configured to indicate a temperature of the memory device; and a control circuit, coupled to the termination register and the temperature sensing circuit, configured to write the termination values to the termination register and to adjust the termination values stored in the termination register in response to a change in the temperature of the memory device.

3. An apparatus comprising:

a termination register configured to store termination values;

a termination control circuit coupled to the termination register; and a plurality of receiver and driver circuits coupled to the termination control circuit, each of the plurality of receiver and driver circuits comprising an adjustable pull-up impedance and an adjustable pull-down impedance wherein the termination control circuit is configured to select impedances for the adjustable pull-up impedances and the adjustable pull-down impedances of the plurality of receiver and driver circuits in response to the stored termination values wherein each adjustable pull up impedance and each pull down impedance comprises a plurality of resistance circuits coupled together in parallel, and the plurality of resistance circuits for the adjustable pull up impedance are coupled in parallel a control circuit; and a temperature sensor coupled to the control circuit, wherein the control circuit is configured to change the stored termination values in response to a temperature measured by the temperature sensor.

4. The apparatus of claim 3 wherein each of the adjustable pull-up impedances is coupled between an I/O node and a first voltage node.

5. The apparatus of claim 4 wherein each of the adjustable pull-up impedances comprises:

the plurality respectively of resistance circuits coupled in parallel wherein each resistance circuit comprises a resistance coupled in series with a transistor controllable by the termination control circuit.

6. The apparatus of claim 3 wherein each of the adjustable pull-down impedances is coupled between an I/O node and a reference voltage.

7. The apparatus of claim 6 wherein each of the adjustable pull-down impedances comprises:

the plurality respectively of resistance circuits coupled in parallel wherein each resistance circuit comprises a resistance coupled in series with an NMOS transistor controllable by the termination control circuit.

8. The apparatus of claim 3 wherein the termination register is part of a non-volatile memory array.

9. A method comprising:

storing termination values in a termination register; and selectively adjusting an impedance ratio of a termination circuit, coupled to an I/O node, by a termination control circuit in response to the stored termination values wherein the termination circuit comprises a plurality of receiver and driver circuits comprising an adjustable pull-up impedance and an adjustable pull-down impedance, the termination control circuit selecting impedances for the adjustable pull-up impedances and the adjustable pull-down impedances of the plurality of receiver and driver circuits in response to the stored termination values wherein each adjustable pull-up impedance and each adjustable pull-down impedance comprises a plurality of resistance circuits coupled together in parallel, the plurality of resistance circuits for the adjustable pull-down impedance are coupled in parallel between an output pin of a memory device and a ground voltage and the plurality of resistance circuits for the adjustable pull-up impedance are coupled between the output pin and a supply voltage node;

a voltage sensor measuring a voltage at which the memory device is operating;

a control circuit adjusting the termination values stored in the termination register in response to the measured voltage; and adjusting the termination values stored in the termination register in response to a change in a temperature sensed by a temperature sensor.

10. The method of claim 9 wherein selectively adjusting the impedance ratio of the termination circuit comprises:

selectively adjusting a pull-up impedance in response to the termination values; and selectively adjusting a pull-down impedance in response to the termination values.

11. The method of claim 9 wherein the method further comprises:

transmitting data from the memory device; and dynamically changing the termination values during operation of the memory device in order to change a centerline voltage of the transmitted data.

* * * * *